United States Patent
Holmes et al.

(10) Patent No.: US 7,230,681 B2
(45) Date of Patent: Jun. 12, 2007

(54) METHOD AND APPARATUS FOR IMMERSION LITHOGRAPHY

(75) Inventors: Steven J. Holmes, Guilderland, NY (US); Toshiharu Furukawa, Essex Junction, VT (US); Mark C. Hakey, Fairfax, VT (US); Daniel A. Corliss, Hopewell Junction, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 149 days.

(21) Appl. No.: 10/904,599

(22) Filed: Nov. 18, 2004

(65) Prior Publication Data

US 2006/0103830 A1    May 18, 2006

(51) Int. Cl.
G03B 27/60    (2006.01)
G03B 27/42    (2006.01)
G03B 27/58    (2006.01)
G03B 27/62    (2006.01)

(52) U.S. Cl. .............................. 355/75; 355/53; 355/72; 355/73; 355/76

(58) Field of Classification Search ................... 355/53, 355/72, 75
See application file for complete search history.

(56) References Cited

U.S. PATENT DOCUMENTS

| | | | |
|---|---|---|---|
| 5,160,959 A * | 11/1992 | Everett et al. ................. | 355/53 |
| 5,610,683 A * | 3/1997 | Takahashi ...................... | 355/53 |
| 5,824,457 A | 10/1998 | Liu et al. | |
| 6,770,424 B2 | 8/2004 | Mandal et al. | |
| 6,809,794 B1 | 10/2004 | Sewell | |
| 2003/0116176 A1 | 6/2003 | Rothman et al. | |
| 2004/0035448 A1 | 2/2004 | Aegerter et al. | |
| 2004/0136494 A1 | 7/2004 | Lof et al. | |
| 2004/0160582 A1 | 8/2004 | Lof et al. | |
| 2004/0207824 A1 | 10/2004 | Lof et al. | |
| 2004/0211920 A1 | 10/2004 | Maria Derksen et al. | |

* cited by examiner

*Primary Examiner*—Henry Hung Nguyen
*Assistant Examiner*—Marissa A Ohira
(74) *Attorney, Agent, or Firm*—Schmeiser, Olsen & Watts; Steven Capella

(57) ABSTRACT

An apparatus for holding a wafer and a method for immersion lithography. The apparatus, including a wafer chuck having a central circular vacuum platen, an outer region, and a circular groove centered on the vacuum platen, a top surface of the vacuum platen recessed below a top surface of the outer region and a bottom surface of the groove recessed below the top surface of the vacuum platen; one or more suction ports in the bottom surface of the groove; and a hollow toroidal inflatable and deflatable bladder positioned within the groove.

36 Claims, 10 Drawing Sheets

METHOD AND APPARATUS FOR IMMERSION LITHOGRAPHY

BACKGROUND OF THE INVENTION

Field of the Invention

The present invention relates to the field of semiconductor manufacturing processes; more specifically, it relates to a method of and apparatus for immersion lithography.

Immersion lithography is emerging as a technology for extending optical photolithography to smaller image sizes than currently printable with conventional optical lithography tools. Immersion lithography places an immersion liquid in direct contact with the photoresist layer to be exposed and the final image-focusing lens of the immersion lithography system is either immersed in the liquid or placed in very close proximity to the immersion liquid. The immersion liquid allows increase of the capture angle of the Raleigh criterion of resolution (thus increasing resolution) by application of Snell's law of refraction and thus smaller images can be formed than could otherwise be possible in lithography systems with only air between the photoresist layer and the final image-focusing lens.

However, a significant problem with immersion lithography is immersion liquid getting into the gap between the edge of the wafer being processed and the chuck holding the wafer during immersion lithography. This causes splashing of immersion liquid onto the surface of the photoresist layer on the wafer and subsequent formation of residues and/or bubbles, which may cause defects in subsequent wafer processing.

Therefore, there is a need for a method and apparatus less likely to transfer immersion liquid from the gap or other portions of the chuck onto the surface of the photoresist layer on the wafer.

SUMMARY OF THE INVENTION

The present invention provides an inflatable and deflatable bladder between an interior edge of a wafer chuck holding the wafer during immersion lithography and the peripheral edge of the wafer, preventing immersion liquid from entering the gap between the interior edge of the wafer chuck and the wafer.

A first aspect of the present invention is an apparatus for holding a wafer, comprising a wafer chuck having a central circular vacuum platen, an outer region, and a circular groove centered on the vacuum platen, a top surface of the vacuum platen recessed below a top surface of the outer region and a bottom surface of the groove recessed below the top surface of the vacuum platen; one or more suction ports in the bottom surface of the groove; and a hollow toroidal inflatable and deflatable bladder positioned within the groove.

A second aspect of the present invention is an immersion exposure system for exposing a photoresist layer on a top surface of a wafer to light, comprising: a light source, one or more focusing lenses, a mask holder, a slit, an immersion head and a XY-stage, the light source, the one or more focusing lenses, the mask holder, the slit, and the immersion head aligned to an optical axis, the XY-stage moveable in two different orthogonal directions, each the orthogonal direction orthogonal to the optical axis, the mask holder and the slit moveable in one of the two orthogonal directions, the immersion head having a chamber having a top, a sidewall and a bottom opening, the top transparent to selected wavelengths of light; means for filling the chamber of the immersion head with an immersion liquid, the chamber aligned to the optical axis; and a wafer chuck mounted on the XY-stage, the wafer chuck having a central circular vacuum platen, an outer region, and a circular groove centered on the vacuum platen, a top surface of the vacuum platen recessed below a top surface of the outer region and a bottom surface of the groove recessed below the top surface of the vacuum platen, one or more suction ports in the bottom surface of the groove and a hollow toroidal inflatable and deflatable bladder positioned within the groove.

A third aspect of the present invention is a method of performing immersion lithography through a mask onto a photoresist layer on a top surface of a wafer in an immersion lithography system having an immersion head, comprising: (a) providing a wafer chuck, the wafer chuck having a central circular vacuum platen, an outer region, and a circular groove centered on the vacuum platen, a top surface of the vacuum platen recessed below a top surface of the outer region and a bottom of the groove recessed below the top surface of the vacuum platen, one or more suction ports in the bottom surface of the groove and a hollow toroidal inflatable and deflatable bladder positioned within the groove; (b) loading the wafer onto the vacuum platen and applying vacuum to the vacuum plate; after step (b), (c) inflating the bladder, the bladder contacting an entire edge of the wafer; after step (c), (d) moving the wafer chuck under the immersion head of the immersion lithography system and exposing the photoresist layer to light through the mask; after step (d), (e) removing the wafer chuck from under the immersion head; after step (e), (f) deflating the bladder; after step (f), (g) applying vacuum to the suction ports in the bottom surface of the groove of the wafer chuck if vacuum is not already being applied to the suction ports; and after step (g), (h) turning off the vacuum applied to the vacuum platen in step (b) and removing the wafer from the vacuum platen.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

For the purpose of the present invention the term wafer will be used to indicate any semiconductor substrate, examples of which include but are not limited to bulk silicon substrates, silicon-on-insulator (SOI) substrates, silicon-germanium substrates, sapphire substrates, and other semiconductor substrates used for the manufacturing of integrated circuits.

Figure 1:
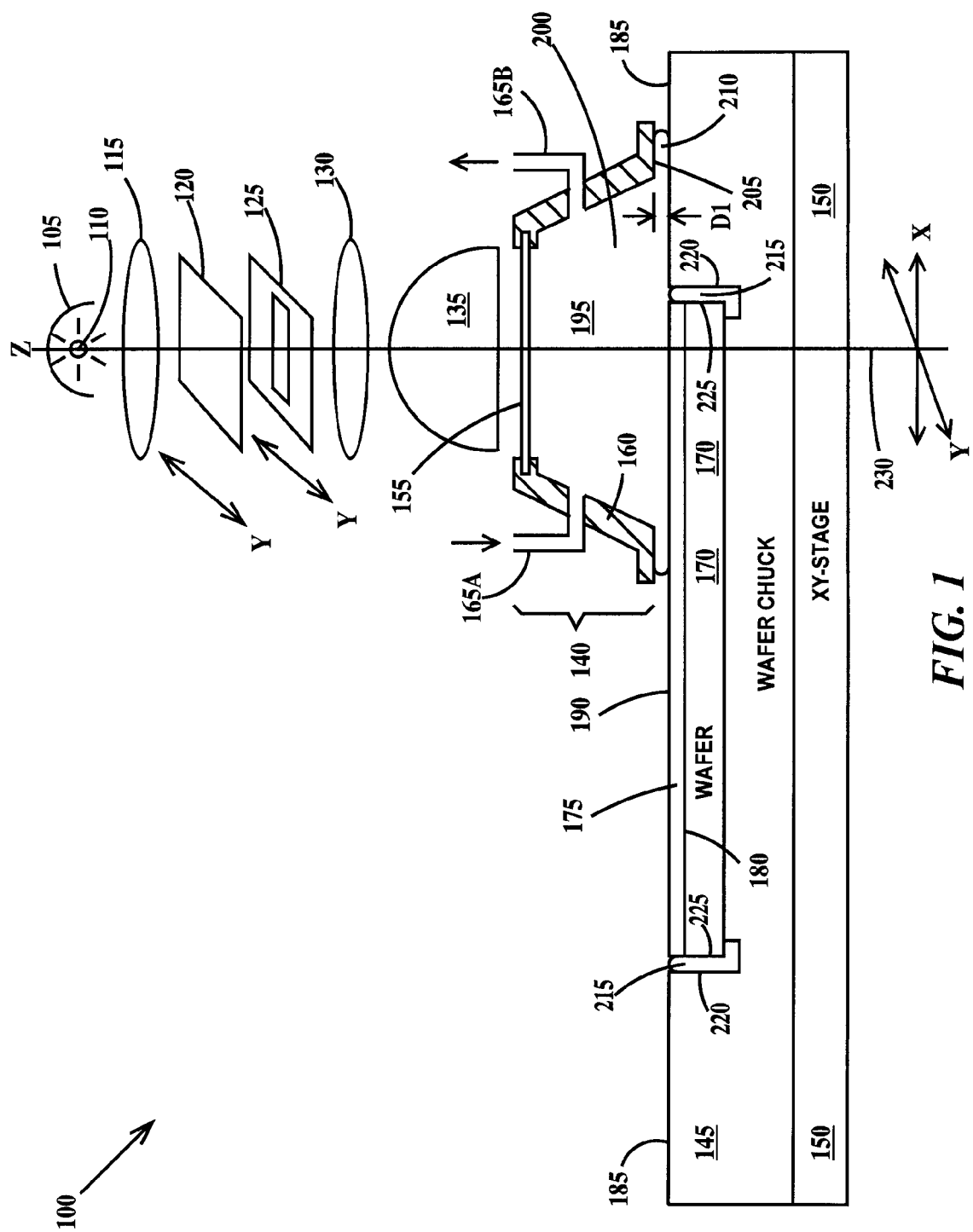
FIG. 1 is a pictorial representation of an exemplary immersion lithography system according to the present invention.

FIG. 1 is a pictorial representation of an exemplary immersion lithography system according to the present invention. In FIG. 1, an immersion lithography system 100 includes a focusing mirror 105, a light source 110, a first focusing lens (or set of lenses) 115, a mask 120, an exposure slit 125, a second focusing lens (or set of lenses) 130, a final focusing lens 135, an immersion head 140 and a wafer chuck 145 mounted on an XY-stage 150. Immersion head 140 includes a transparent window 155, a slanted circular sidewall 160, an immersion liquid inlet 165A and an immersion liquid outlet 165B. A wafer 170 is removably mounted in wafer chuck 145. A photoresist layer 175 has been formed on a top surface 180 of wafer 170. A top surface 185 of wafer chuck 145 is about coplanar with a top surface 190 of photoresist layer 175. Top surface 190 of photoresist layer 175, sidewall 160 and window 155 define a chamber 195 that is filled with an immersion liquid 200. A bottom surface 205 of immersion head 140 is held a distance D1 from top surface 190 of photoresist layer 175 and top surface 185 of wafer chuck 145. Distance D1 is small enough to allow formation of a meniscus 210 under bottom edge 205 of immersion head 140. In one example D1 is about 3 microns to about 100 microns. A circular hollow inflatable and deflatable bladder 215 having a roughly toroidal shape is placed between an inner wall 220 of chuck 145 and a peripheral edge 225 of wafer 170. Window 155 must be transparent to the wavelength of light selected to expose photoresist layer 175. In one example, window 155 is transparent to a wavelength of about 190 nm or less.

Focusing mirror 105, light source 110, first focusing lens 115, mask 120, exposure slit 125, second focusing lens 130, final focusing lens 135, immersion head 140 are all aligned along an optical axis 230 which also defines a Z direction. An X direction is defined as a direction orthogonal to the Z direction and in the plane of the drawing. A Y direction is defined as a direction orthogonal to both the X and Z directions. Wafer chuck 145 may be moved in the X and Y directions during the exposure process to allow formation of regions of exposed and unexposed photoresist in photoresist layer 175. As XY-stage 150 moves, new portions of photoresist layer 175 are brought into contact with immersion liquid 200 and previously immersed portions of the photoresist layer are removed from contact with the immersion liquid. Mask 120 and slit 125 may be moved in the Y direction to scan the image (not shown) on mask 120 onto photoresist layer 175. In one example, the image on mask 120 is a 1× to a 10× magnification version of the image to be printed and includes one or multiple integrated circuit chip images.

When exposure is complete, wafer 170 is removed from under immersion head 140 without spilling immersion fluid 200. To this ends a cover plate (not shown) is moved to first abut with wafer chuck 145 and then moved with the wafer chuck as the wafer chuck is moved out of position from under immersion head 140, the cover plate replacing the wafer chuck under immersion head 140. Immersion head 140 does not move, but stays aligned to optical axis 230. In FIG. 1, immersion head 140 is shown over bladder 215 during exposure of an outer region of photoresist layer 175. Bladder 215 prevents immersion fluid from spilling into the gap between peripheral edge 225 of wafer 170 and inner wall 220 of chuck 145.

Figure 2A:
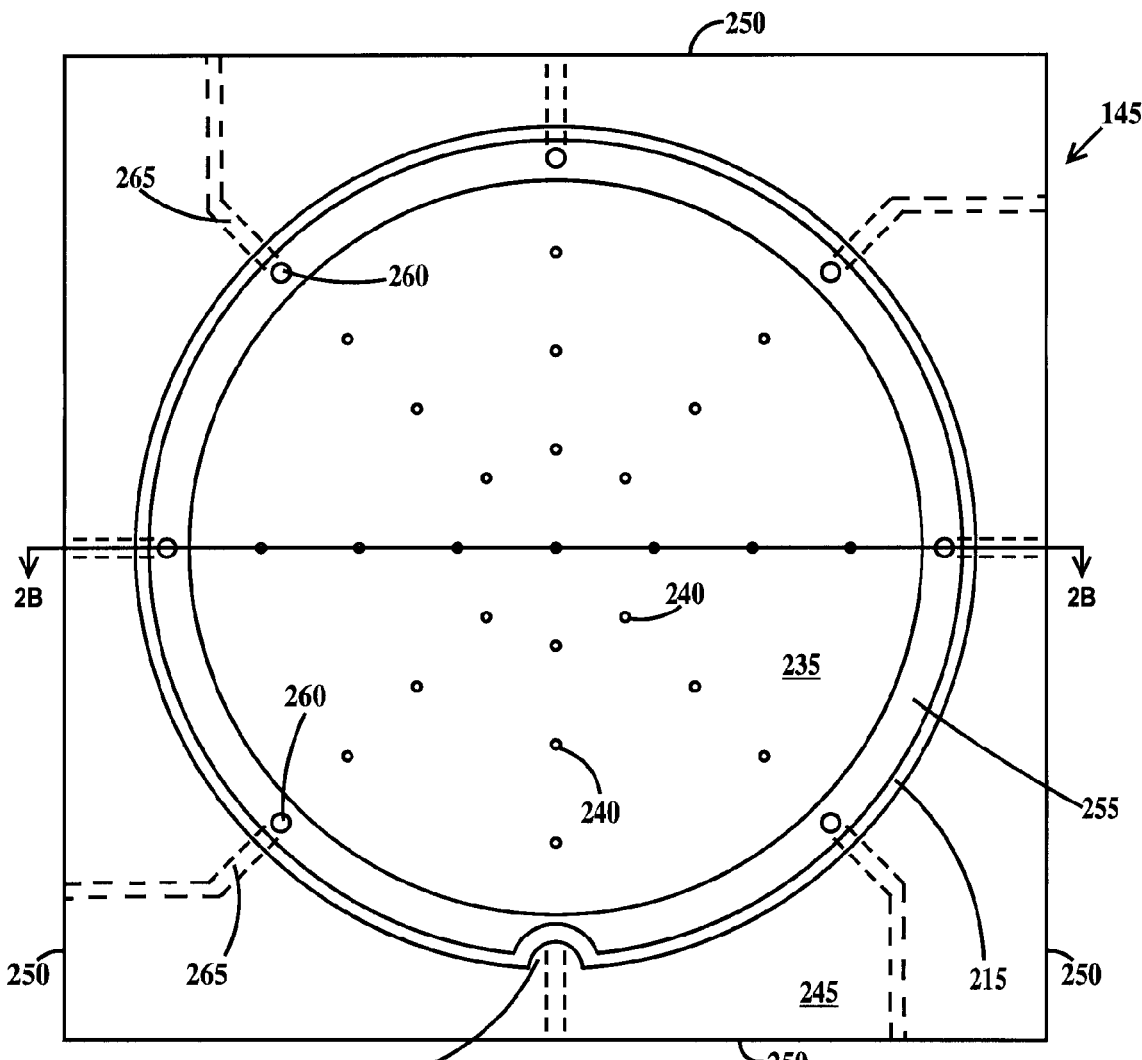
FIG. 2A is a top view and FIG. 2B is a cross-section view through line 2B-2B of the wafer chuck of FIG. 1 according to a first embodiment of the present invention.
Figure 2B:
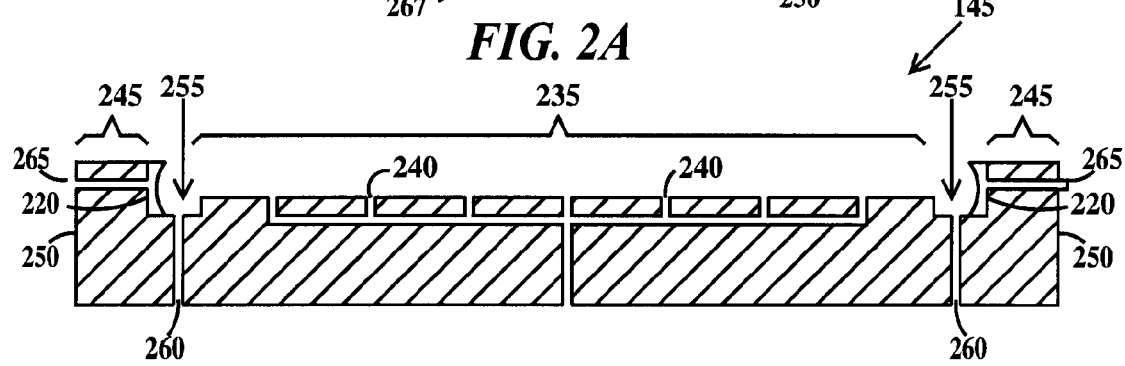

FIG. 2A is a top view and FIG. 2B is a cross-section view through line 2B-2B of wafer chuck 145 of FIG. 1 according to a first embodiment of the present invention. In FIGS. 2A and 2B, wafer chuck 145 includes a circular vacuum platen 235 having a multiplicity of vacuum ports 240 dispersed along the surface of the platen and includes a square (or rectangular) outer region 245 having a circular inner wall 220 and outer edges 250. Alternatively, vacuum ports 240 may open to a series of shallow concentric grooves in the top of the vacuum platen. Vacuum platen 235 and outer region 245 are separated by a concentric circular groove 255 having a multiplicity of suction ports 260 evenly dispersed along the bottom of the groove. Vacuum platen 235 is recessed below outer region 245 and groove 255 is recessed below the vacuum platen and the outer region. Bladder 215 is positioned on inner wall 220 of outer region 245. Bladder 215 includes a multiplicity of inflation and deflation tubes 265 evenly dispersed along the periphery of the bladder and extending to outer edges 250 of outer region 245.

Outer region 245 may include an optional extending portion 267 adapted to mate with an orientation notch (or notches) often formed on semiconductor wafers. Bladder 215 would then be adapted to conform to extending portion 267.

As stated supra, when exposure is complete, wafer 170 must be removed from under immersion head 140 (see FIG. 1) without spilling immersion fluid 200. The purpose of outer region 245 is to prevent loss of immersion liquid 200 when wafer chuck 145 transits from under immersion head 140 (see FIG. 1). Groove 255 is necessary to provide clearance when loading wafers onto vacuum platen 235 and removing wafers from the vacuum platen. Without bladder 215, immersion liquid would spill into the gap between outer region 245 and vacuum platen 255 created by groove 255.

FIGS. 3 through 8 are partial cross-sectional views illustrating the operation of a wafer chuck according to the present invention. FIGS. 3 through 8 are in sequential order.

Figure 3:
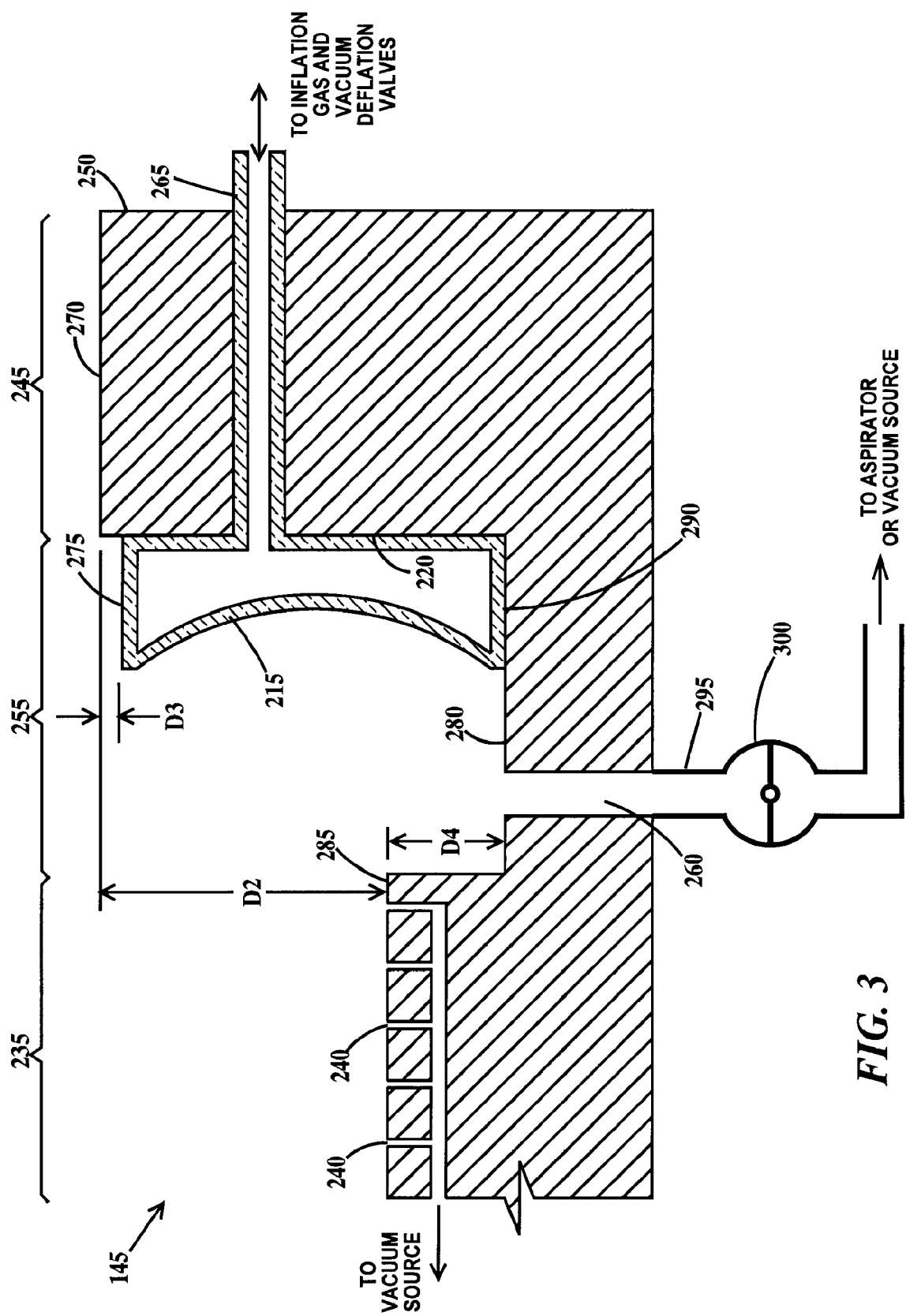
FIGS. 3 through 8 are partial cross-sectional views illustrating the operation of the wafer chuck of FIG. 1 according to the present invention.

In FIG. 3, vacuum platen 235 is recessed a distance D2 below a top surface 270 of outer region 245. A top surface 275 of bladder 215 is recessed a distance D3 from top surface 270 of outer region 245 when the bladder is deflated as shown. A bottom 280 of groove 255 is recessed a distance D4 below a top surface 285 of vacuum platen 235. The depth of groove 255 from top surface 270 of outer region 145 of wafer chuck 145 is D2+D4. A bottom surface 290 of bladder 215 contacts bottom 280 of groove 255. A suction manifold 295 is fitted to suction ports 260 and a valve 300 is fitted between the suction ports and an aspirator or vacuum source (not shown). Inflation and deflation tubes 265 are fitted to a valve system (not shown) to allow switching between an inflation gas to inflate bladder 215 and a vacuum source to deflate the bladder. Alternatively, inflation and deflation tubes 265 may be fitted to a hydraulic cylinder so that fluid may be forced into bladder 215 to inflate the bladder, and withdrawn from the bladder to deflate the bladder.

Figure 4:
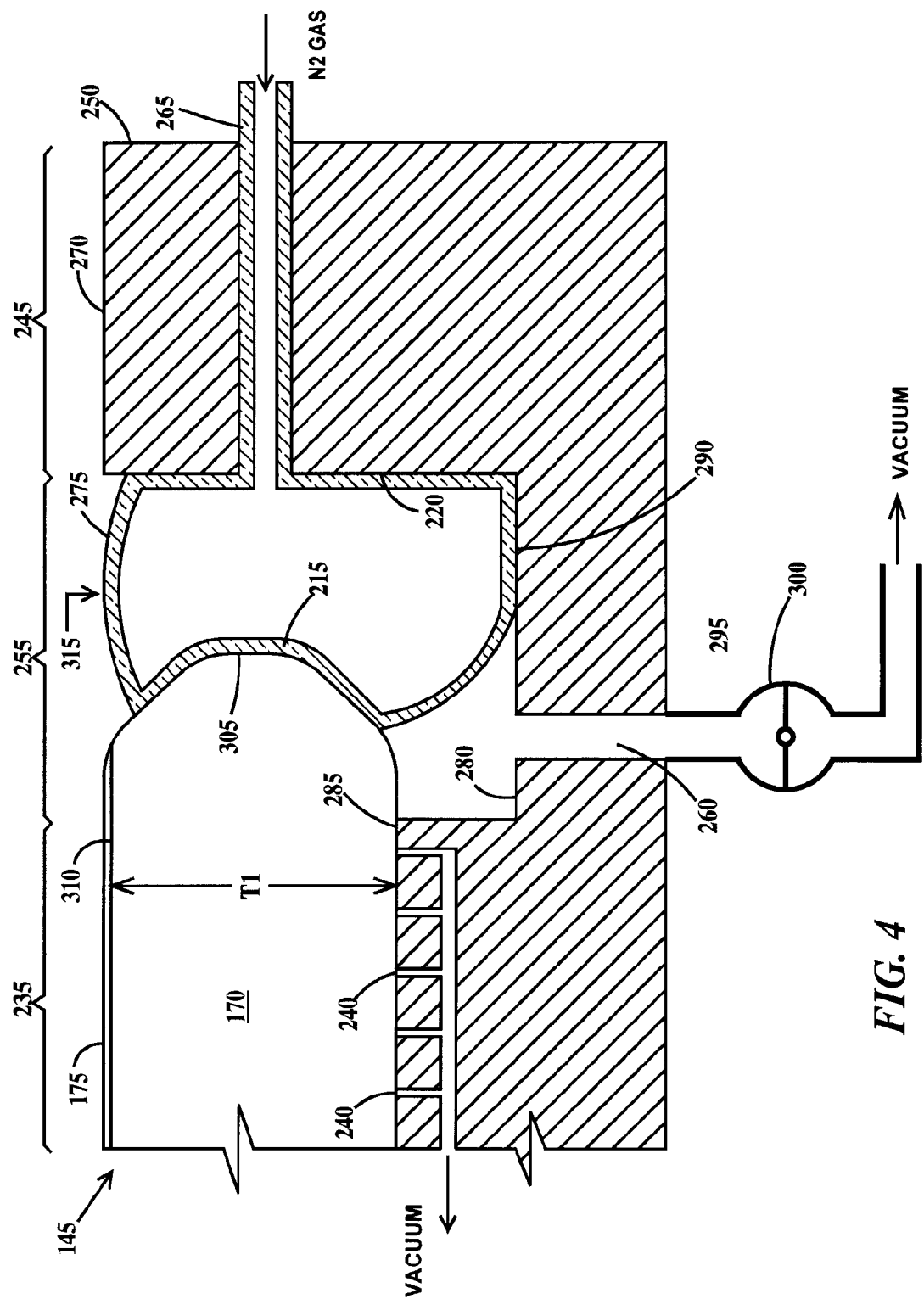

In FIG. 4, wafer 170 is placed on vacuum platen 235 and vacuum applied to vacuum ports 240 to temporarily fix the wafer to the wafer platen and a fluid (for example, argon, nitrogen, water or any other suitable fluid) is forced through inflation/deflation tubes 265 to inflate bladder 215 so that it touches a peripheral edge 305 of wafer 170. Wafer 170 has a thickness T1. Distance D2 (see FIG. 3) is about equal to thickness T1 so a top surface 310 of wafer 170 is about coplanar with top surface 270 of outer ring 245. Generally the thickness of photoresist layer 175 on top surface 310 of wafer 170 is about an order of magnitude less than the thickness variation of the wafer so that the thickness of the photoresist layer can be ignored relative to coplanarity to top surface 270 of outer region 245. In one example, photoresist layer 175 is about 0.5 to about 2.0 microns thick, and thickness T1 is about 600 microns to about 1000 microns. In one example, an uppermost point 315 on top surface 275 of bladder 215 is about coplanar with or slightly recessed below top surface 270 of outer region 245. Note, in FIG. 4, valve 300 is closed.

Alternatively, uppermost point 315 extends a distance above top surface 270 by an amount less than the distance between top surface 190 of photoresist layer 175 and bottom surface 205 of immersion head 140 (see FIG. 1). In one example, uppermost point 315 on top surface 275 of bladder 215 extends between about 3 microns and about 100 microns above top surface 190 (see FIG. 1) of photoresist layer 175.

Bladder 215 may be fabricated from various materials. In one example bladder 215 comprises a material selected from the group consisting of polytetrafluoroethylene, neoprene, acrylonitrile/butadiene (NBR), ethylene/propylene/diene (EPDM), ethylene/propylene/cyclohexadiene, polyurethane, isoprene, fluoro elastomers and elastomers.

Figure 5:
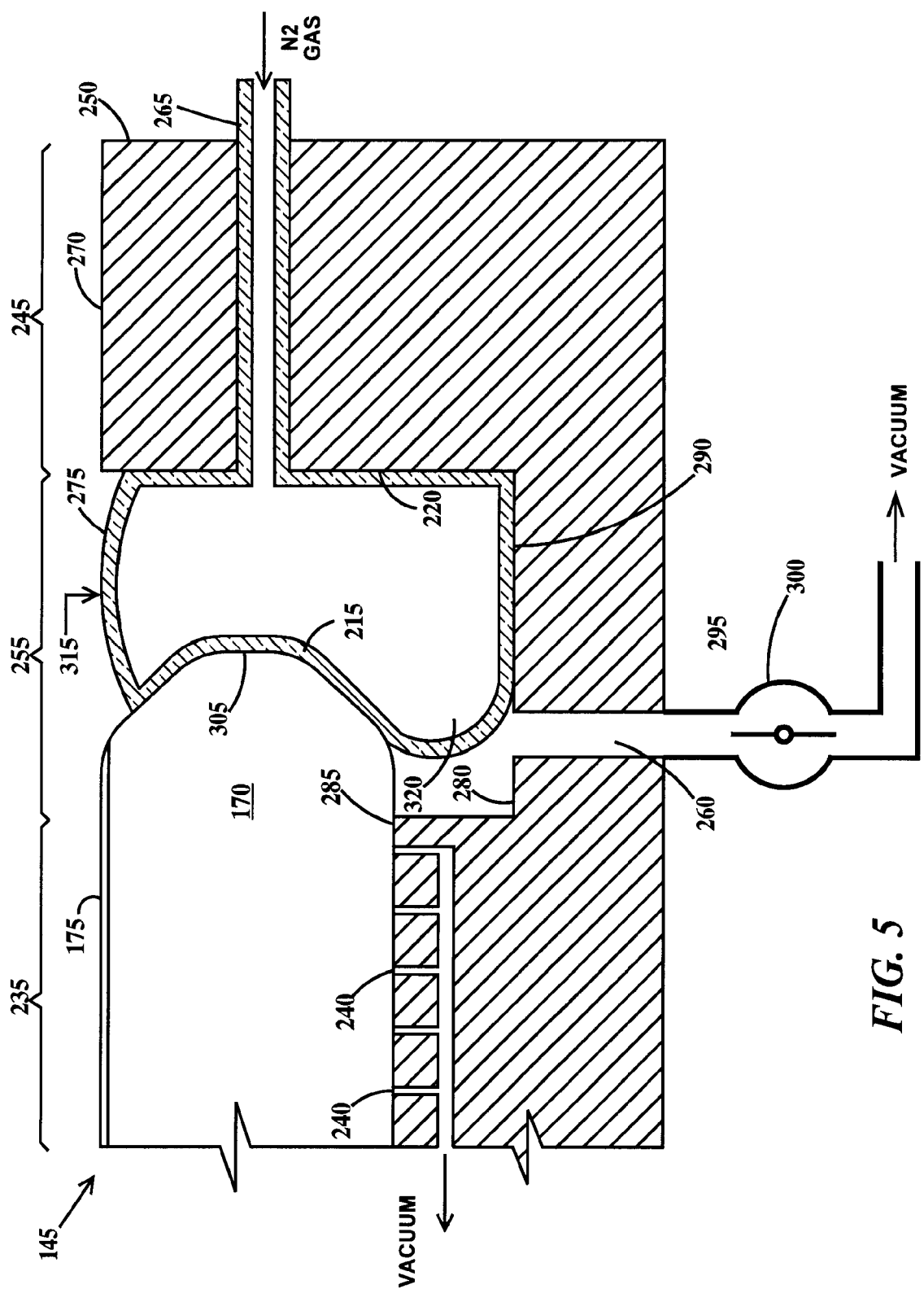

In FIG. 5, valve 300 is opened in bladder 215 and the negative vacuum pressure distends the bladder forming a bulge 320 in the bladder extending the bladder further under peripheral edge 305 of wafer 170. The operation illustrated in FIG. 5 is optional.

Figure 6:
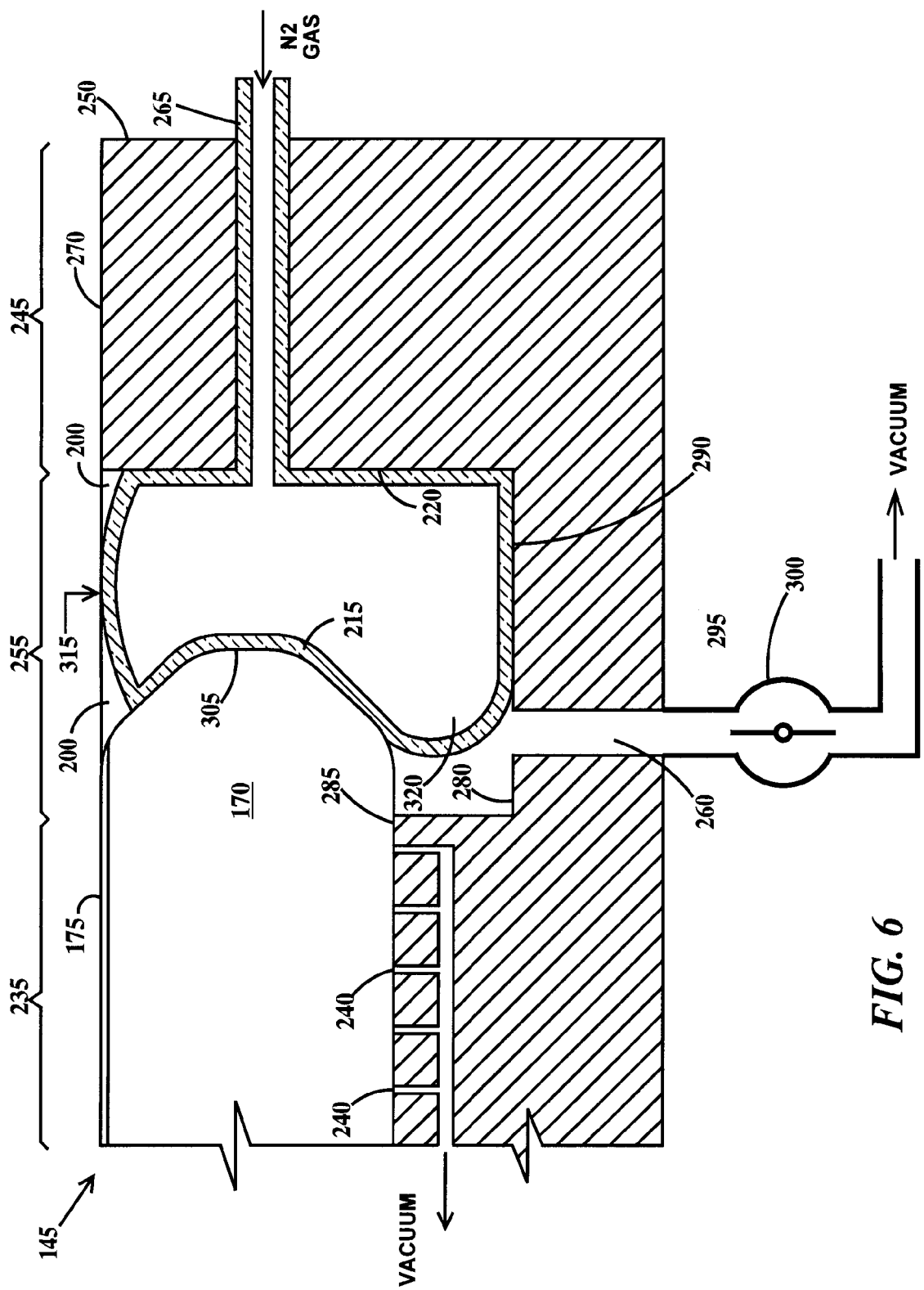

In FIG. 6, a small quantity of immersion liquid 200 collects on top of bladder 215 between uppermost point 315 of bladder 215 and wafer 170 and between the uppermost point and outer region 245.

Figure 7:
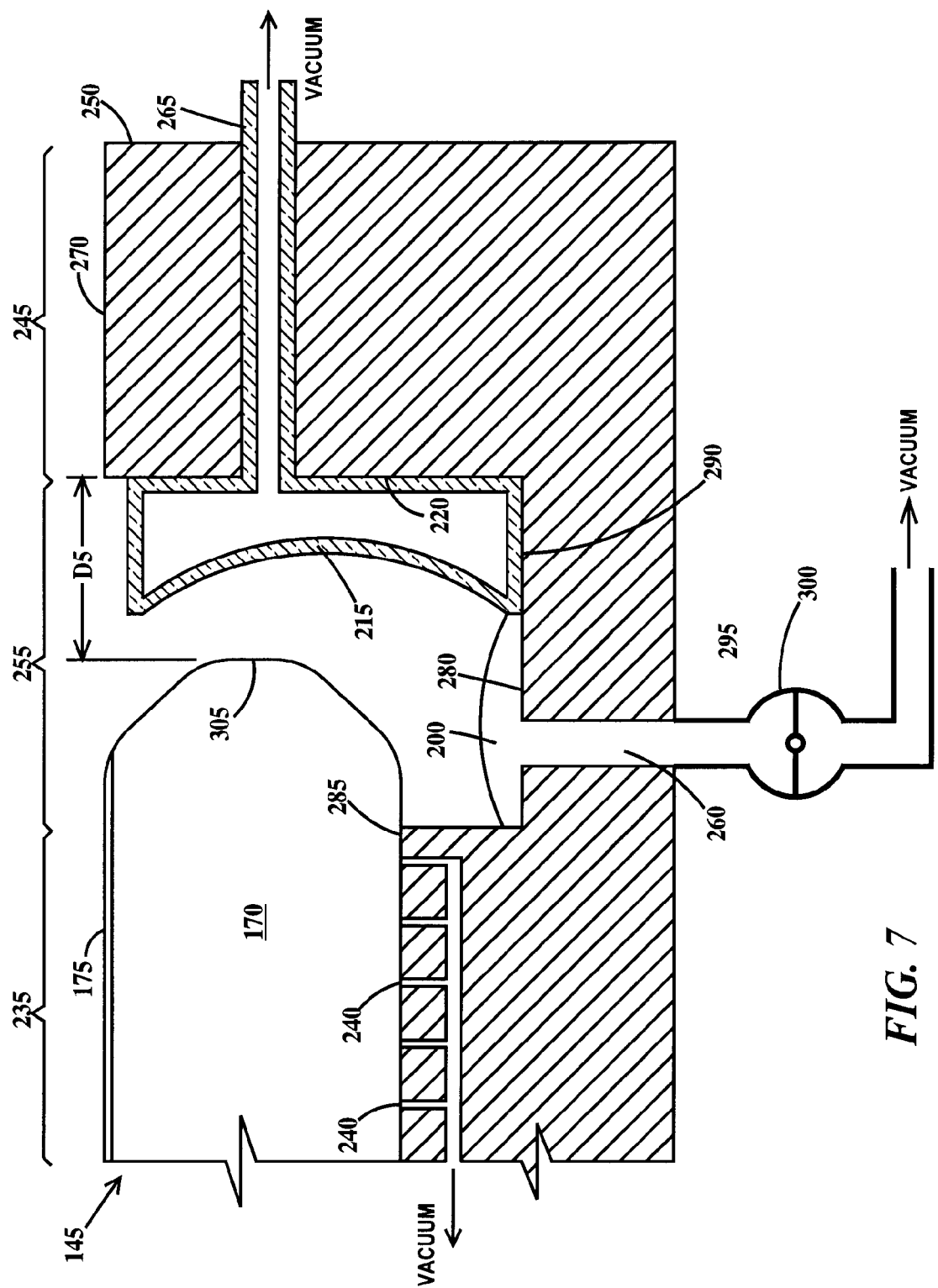

In FIG. 7, wafer chuck 145 is moved from under immersion head 140 (see FIG. 1), valve 300 closed and bladder 215 deflated allowing immersion liquid 200 to drop to the bottom of groove 255. FIG. 7 also illustrates wafer 170 is a distance D5 from inner wall 220 of outer region 245 of wafer chuck 145. In one example, D5 is about 0.2 mm to about 3 mm and deflated bladder 215 extends a distance equal to about D5 divided by 2 from inner wall 220.

Figure 8:
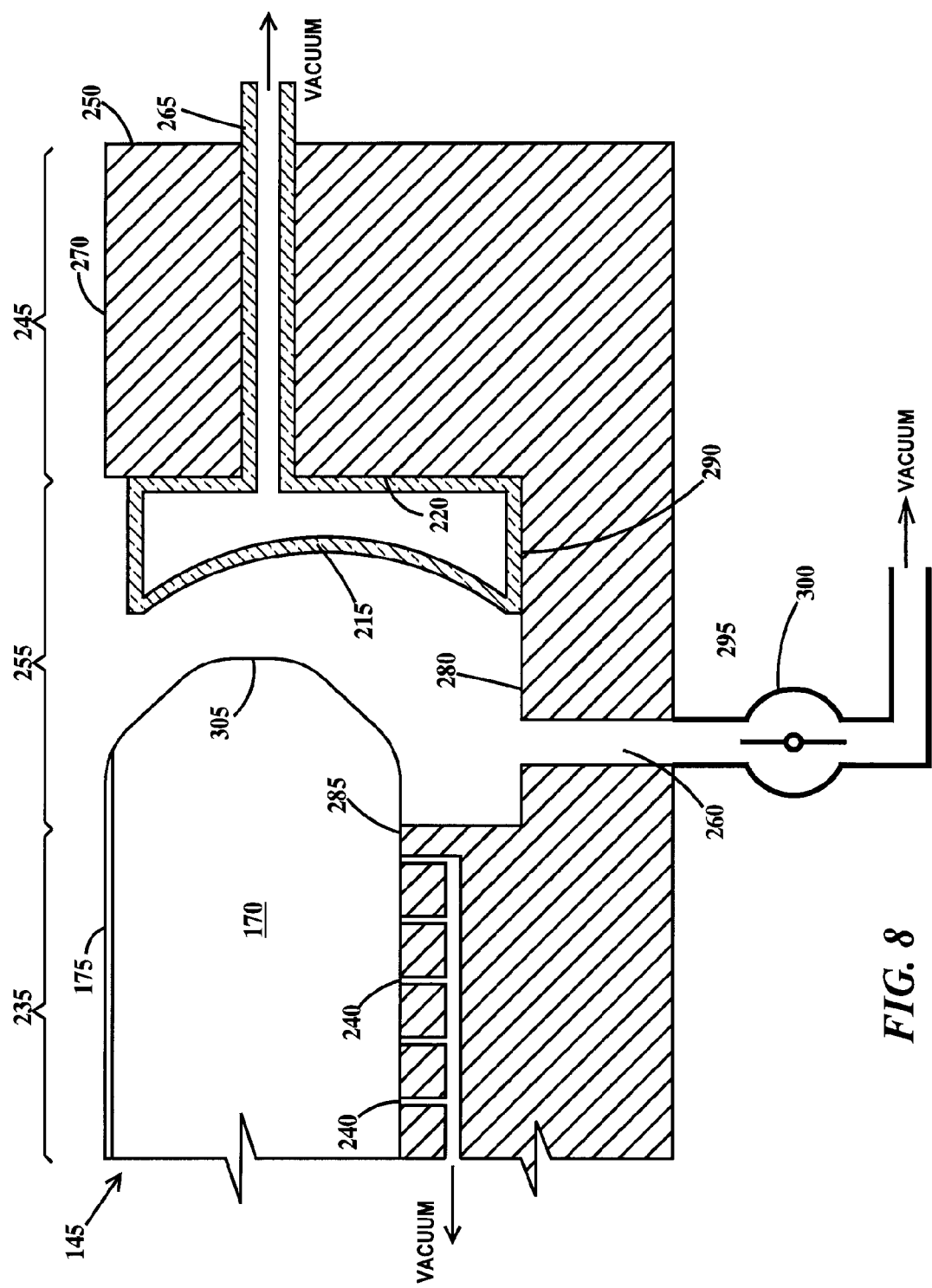

In FIG. 8, valve 300 is opened and immersion fluid 200 accumulated in groove 255 (see FIG. 7) is removed. Valve 300 is then closed; vacuum is removed from vacuum ports 240 and wafer 170 is removed from vacuum platen 235.

Figure 9:
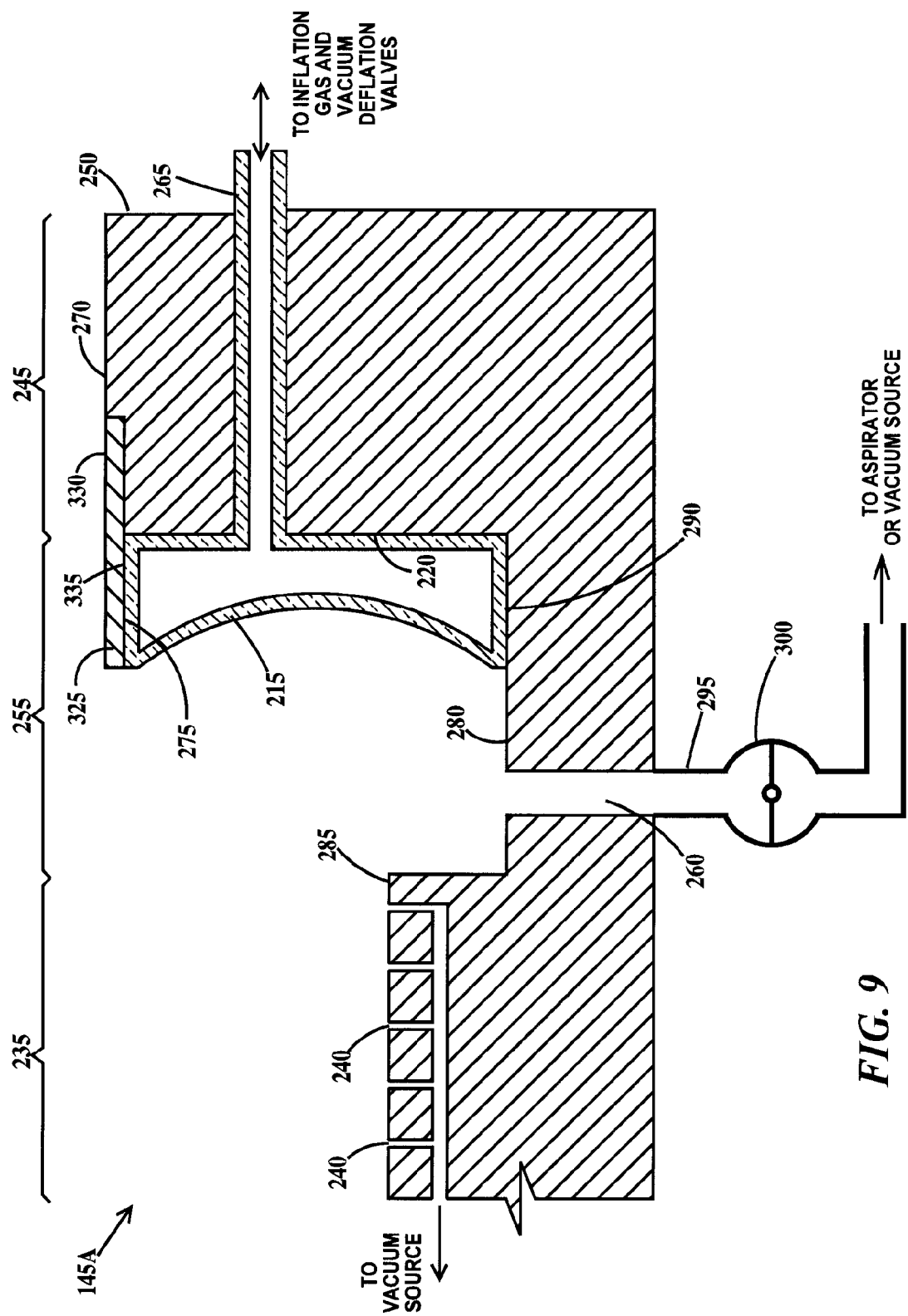
FIG. 9 is a partial cross-section view of a second embodiment of the wafer chuck of FIG. 1.

FIG. 9 is a partial cross-section view of a second embodiment of the wafer chuck of FIGS. 2A and 2B. In FIG. 9, a wafer chuck 145A is similar to and operates identically to wafer chuck 145 of FIG. 3 except a ring 325 is recessed into outer region 245. A top surface of ring 325 is coplanar with top surface 270 of outer region 245 of wafer chuck 145A. Ring 325 extends over groove 255 about the length of top surface 275 of bladder 215 when bladder 215 is deflated. A bottom surface 335 of ring 325 contacts top surface 275 of bladder 215.

Figure 10:
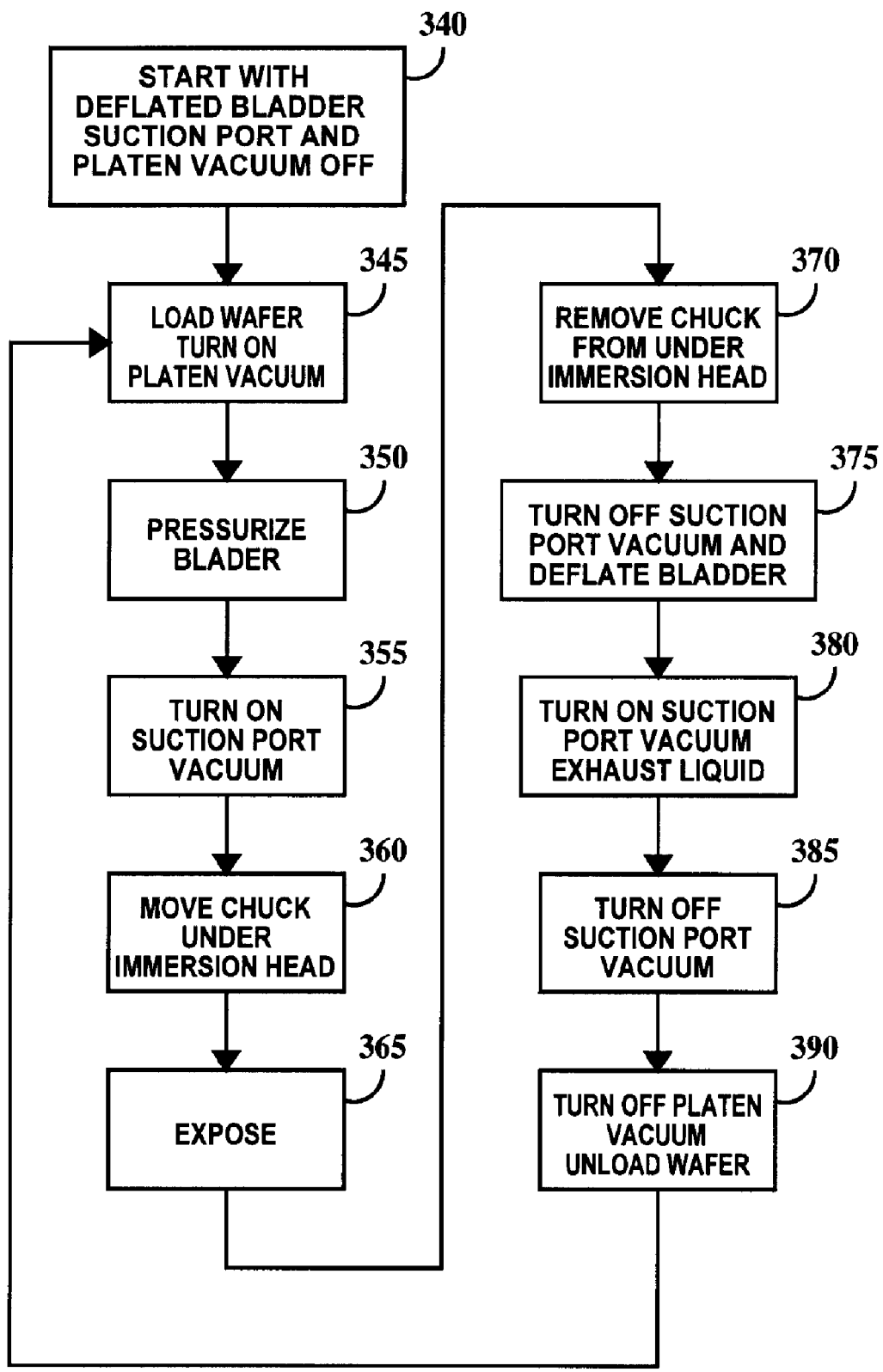
FIG. 10 is a flowchart of the steps of performing immersion lithography according to the present invention.

FIG. 10 is a flowchart of the steps of performing immersion lithography according to the present invention. In step 340, the bladder is deflated and the suction port and platen vacuum is off. In step 345, a wafer is loaded onto the wafer chuck and platen vacuum turned on to hold the wafer to the vacuum platen. In step 350, the bladder is pressurized, thus inflating the bladder so the bladder contacts the edge of the wafer. In step 355, the suction port vacuum is optionally turned on, further distending the bladder under the edge of the wafer. In step 360, the wafer chuck is positioned under the immersion head. In step 365, the photoresist layer on top of the wafer is patterned by exposing the photoresist layer to light projected through a patterned mask. Then, when exposure is complete, in step 370 the wafer chuck is removed from under the immersion head. In step 375, the suction port vacuum is turned off (if the suction port vacuum was turned on in step 355) and then the bladder is deflated. In step 380, the suction port vacuum is turned on and any immersion liquid in the space between the platen and the deflated bladder is removed Alternatively, the suction port vacuum is left on (if it was turned on in step 355) as the bladder is deflated. In step 385, the suction port vacuum is turned off. In step 390, the vacuum platen vacuum is turned off and the wafer is unloaded from the wafer chuck. Steps 345 through 390 are repeated for each wafer to be exposed.

Thus, the present invention provides a method and apparatus less likely to transfer immersion liquid from the gap or other portions of the chuck onto the surface of the photoresist layer on the wafer.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. An apparatus for holding a wafer, comprising
   a wafer chuck having a central circular vacuum platen, an outer region, and a circular groove between said outer region and said vacuum platen, a top surface of said vacuum platen recessed below a top surface of said outer region and a bottom surface of said groove recessed below said top surface of said vacuum platen;
   one or more suction ports in said bottom surface of said groove; and
   a hollow toroidal inflatable and deflatable bladder positioned within said groove, wherein when said bladder is in an inflated state an outer surface of said bladder is in direct physical contact with an entire edge of said wafer when said wafer is on said vacuum platen.

2. The apparatus of claim 1 wherein said bladder is positioned on an outer sidewall of said groove opposite said vacuum platen.

3. The apparatus of claim 1 wherein said bladder, in a deflated state, extends from said bottom surface of said groove, but not above said top surface of said outer region of said wafer chuck.

4. The apparatus of claim 1 wherein said bladder, in an inflated state, extends from said bottom surface of said groove, but not above said top surface of said outer region of said wafer chuck.

5. The apparatus of claim 1 wherein an uppermost portion of said bladder when said bladder is in an inflated state, is about coplanar with said top surface of said outer region of said wafer chuck.

6. The apparatus of claim 1 wherein a difference in height between said top surface of said vacuum platen and said top surface of said outer region of said wafer chuck is about equal to a thickness of said wafer.

7. The apparatus of claim 1 wherein a distance between diametrically opposite outer surfaces of said bladder when said bladder is in a deflated state, is greater than a diameter of said wafer.

8. The apparatus of claim 1 further including one or more vacuum ports open to said top surface of said vacuum platen.

9. The apparatus of claim 1 further including one or more vacuum grooves formed in said top surface of said vacuum platen.

10. The apparatus of claim 1 further including one or more inflation and deflation tubes attached to said bladder.

11. The apparatus of claim 1 wherein said bladder is formed from a material selected from the group consisting of polytetrafluoroethylene, neoprene, acrylonitrile/butadiene, ethylene/propylene/diene, ethylene/propylene/cyclohexadiene, polyurethane, isoprene, fluoro elastomers and elastomers.

12. The apparatus of claim 1 further including a circular ring, recessed into a circular notch along an inner edge of said outer region of said wafer chuck, said ring extending a distance over said groove, a top surface of said ring coplanar with said top surface of said outer region of said wafer chuck.

13. An immersion exposure system for exposing a photoresist layer on a top surface of a wafer to light, comprising:
    a light source, one or more focusing lenses, a mask holder, a slit, an immersion head and a XY-stage, said light source, said one or more focusing lenses, said mask holder, said slit, and said immersion head aligned to an optical axis, said XY-stage moveable in two different orthogonal directions, each said orthogonal direction orthogonal to said optical axis, said mask holder and said slit moveable in one of said two orthogonal directions, said immersion head having a chamber having a top, a sidewall and a bottom opening, said top transparent to selected wavelengths of light;
    means for filling said chamber of said immersion head with an immersion liquid, said chamber aligned to said optical axis; and
    a wafer chuck mounted on said XY-stage, said wafer chuck having a central circular vacuum platen, an outer region, and a circular groove between said outer region and said vacuum platen, a top surface of said vacuum platen recessed below a top surface of said outer region and a bottom surface of said groove recessed below said top surface of said vacuum platen, one or more suction ports in said bottom surface of said groove and a hollow toroidal inflatable and deflatable bladder positioned within said groove, wherein a distance between diametrically opposite outer surfaces of said bladder when said bladder is in a deflated state, is greater than a diameter of said wafer and when said bladder is in an inflated state an outer surface of said bladder is in direct physical contact with an entire edge of said wafer.

14. The apparatus of claim 13 wherein said bladder is positioned on an outer sidewall of said groove opposite said vacuum platen.

15. The apparatus of claim 13 wherein said bladder, in a deflated state or in an inflated state, extends from said bottom surface of said groove, but not above said top surface of said outer region of said wafer chuck.

16. The apparatus of claim 13 wherein an uppermost portion of said bladder when said bladder is in an inflated state, is about coplanar with said top surface of said outer region of said wafer chuck and a top surface of said photoresist layer.

17. The apparatus of claim 13 wherein a difference in height between said top surface of said vacuum platen and said top surface of said outer region of said wafer chuck is about equal to a thickness of said wafer or about equal to said thickness of said wafer plus a thickness of said photoresist layer.

18. The apparatus of claim 13 further including one or more vacuum ports open to said top surface of said vacuum platen or one or more vacuum grooves formed in said top surface of said vacuum platen.

19. The apparatus of claim 13 further including one or more inflation and deflation tubes attached to said bladder.

20. The apparatus of claim 13 wherein said bladder is formed from a material selected from the group consisting of polytetrafluoroethylene, neoprene, acrylonitrile/butadiene (NBR), ethylene/propylene/diene, ethylene/propylene/cyclohexadiene, polyurethane, isoprene, fluoro elastomers and elastomers.

21. The apparatus of claim 13 further including a circular ring, recessed into a circular notch along an inner edge of said outer region of said wafer chuck, said ring extending a distance over said groove, a top surface of said ring coplanar with said top surface of said outer region of said wafer chuck.

22. A method of performing immersion lithography through a mask onto a photoresist layer on a top surface of a wafer in an immersion lithography system having an immersion head, comprising:
    (a) providing a wafer chuck, said wafer chuck having a central circular vacuum platen, an outer region, and a circular groove between said outer region and said vacuum platen, a top surface of said vacuum platen recessed below a top surface of said outer region and a bottom surface of said groove recessed below said top surface of said vacuum platen, one or more suction ports in said bottom surface of said groove and a hollow toroidal inflatable and deflatable bladder positioned within said groove;
    (b) loading said wafer onto said vacuum platen and applying vacuum to said vacuum plate;
    after step (b), (c) inflating said bladder, said bladder contacting an entire edge of said wafer;
    after step (c), (d) moving said wafer chuck under said immersion head of said immersion lithography system and exposing said photoresist layer to light through said mask;
    after step (d), (e) removing said wafer chuck from under said immersion head;
    after step (e), (f) deflating said bladder;
    after step (f), (g) applying vacuum to said suction ports in said bottom surface of said groove of said wafer chuck if vacuum is not already being applied to said suction ports; and
    after step (g), (h) turning off said vacuum applied to said vacuum platen in step (b) and removing said wafer from said vacuum platen.

23. The method of claim 22 further including:
    between steps (c) and (d), applying vacuum to said suction ports in said bottom surface of said groove of said wafer chuck.

24. The method of claim 22 further including:
    between steps (c) and (d), applying vacuum to said suction ports in said bottom surface of said groove of said wafer chuck; and
    between steps (e) and (f), turning off said vacuum applied to said suction ports in said bottom surface of said groove of said wafer chuck.

25. The method of claim 22 wherein step (c) prevents immersion liquid in said immersion head from entering a lower portion of said groove during step (d).

26. The method of claim 22 further including:
    before step (a), providing said immersion photolithography system.

27. The method of claim 22 further including:
before (a), providing said mask.

28. The method of claim 22 wherein said bladder is positioned on an outer sidewall of said groove opposite said vacuum platen.

29. The method of claim 22 step (c) further including:
extending said bladder from said bottom surface of said groove, but not above said top surface of said outer region of said wafer chuck.

30. The method of claim 22 step (c) further including:
extending an uppermost portion of said bladder about coplanar with said top surface of said outer region of said wafer chuck and a top surface of said photoresist layer.

31. The method of claim 22 wherein a difference in height between said top surface of said vacuum platen and said top surface of said outer region of said wafer chuck is about equal to a thickness of said wafer or about equal to said thickness of said wafer plus a thickness of said photoresist layer.

32. The method of claim 22 wherein a distance between diametrically opposite outer surfaces of said bladder when said bladder is in a deflated state, is greater than a diameter of said wafer and when said bladder is in an inflated state an outer surface of said bladder is in direct physical contact with an entire edge of said wafer.

33. The method of claim 22 said wafer chuck further including one or more vacuum ports open to said top surface of said vacuum platen or one or more vacuum grooves formed in said top surface of said vacuum platen.

34. The method of claim 22 said bladder further including one or more inflation and deflation tubes attached to said bladder.

35. The method of claim 22 wherein said bladder is formed from a material selected from the group consisting of polytetrafluoroethylene, neoprene, acrylonitrile/butadiene (NBR), ethylene/propylene/diene, ethylene/propylene/cyclohexadiene, polyurethane, isoprene, fluoro elastomers and elastomers.

36. The method of claim 22 said wafer chuck further including a circular ring, recessed into a circular notch along an inner edge of said outer region of said wafer chuck, said ring extending a distance over said groove, a top surface of said ring coplanar with said top surface of said outer region of said wafer chuck.

* * * * *